(12) United States Patent
Patch et al.

(10) Patent No.: US 7,176,684 B2
(45) Date of Patent: Feb. 13, 2007

(54) METHOD AND SYSTEM OF DETERMINING IN-PLANE MOTION IN PROPELLER DATA

(75) Inventors: Sarah K. Patch, Milwaukee, WI (US); Michael R. Hartley, Novi, MI (US); James G. Pipe, Glendarle, AZ (US)

(73) Assignees: General Electric Company, Schenectady, NY (US); Catholic Healthcare West, California Nonprofit Public Benefit Corporation, d/ba St. Joseph's Hospital and Medical Center, Phoenix, AZ (US)

( * ) Notice: Subject to any disclaimer, the term of this patent is extended or adjusted under 35 U.S.C. 154(b) by 3 days.

(21) Appl. No.: 11/170,054

(22) Filed: Jun. 29, 2005

(65) Prior Publication Data

US 2007/0001672 A1 Jan. 4, 2007

(51) Int. Cl.
*G01V 3/00* (2006.01)

(52) U.S. Cl. ...................................... 324/307; 324/309

(58) Field of Classification Search ................. 324/307
See application file for complete search history.

(56) References Cited

U.S. PATENT DOCUMENTS 6,853,189 B1 2/2005 Pipe
6,882,148 B2 4/2005 Pipe

OTHER PUBLICATIONS

Noll, D. et al., "Homodyne Detection in Magnetic Resonance Imaging", IEEE Transactions on Medical Imaging, 1991, vol. 10, pp. 154-163.
Pipe JG, "Motion Correction with Propeller MRI," Magn Reson Med 42:963-969, 1999.

*Primary Examiner*—Diego Gutierrez
*Assistant Examiner*—Megann E Vaughn
(74) *Attorney, Agent, or Firm*—Ziolkowski Patent Solutions Group, SC; Michael A. Della Penna; Carl B. Horton

(57) ABSTRACT

The present invention is directed to a method of MR imaging whereby a k-space blade extending through a center of k-space from a subject in motion is acquired. A high-pass convolution of the k-space blade with a reference k-space blade is then determined and converted to a δ function. In-plane motion of the subject during data acquisition of the k-space is then determined from the δ function.

34 Claims, 5 Drawing Sheets

METHOD AND SYSTEM OF DETERMINING IN-PLANE MOTION IN PROPELLER DATA

BACKGROUND OF THE INVENTION

The present invention relates generally to magnetic resonance (MR) imaging and, more particularly, to a method and system of determining in-plane motion of a subject from which MR data is acquired in a Periodically Rotated Overlapping Parallel Lines with Enhanced Reconstruction (PROPELLER) acquisition, or variant thereof.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Fast Spin Echo (FSE) imaging is an imaging technique commonly used as an efficient method of collecting MRI data with minimal artifact. Generally, FSE requires that the refocusing $B_1$ pulses be applied between each echo such that their phase is substantially identical to that of the initial spin phase after excitation, commonly referred to as the "CPMG" condition. If this condition is not met, the resulting MR signal is generally highly sensitive to the strength of $B_1$, and therefore will generally decay rapidly in successive echoes.

FSE imaging is an imaging technique that has been implemented with a number of pulse sequence designs. For example, PROPELLER is an FSE technique that encodes an MR signal by collecting data during an echo train such that a rectangular strip, or "blade", through the center of k-space is measured. This strip is incrementally rotated in k-space about the origin in subsequent echo trains, thereby allowing adequate measurement of the necessary regions of k-space for a desired resolution. PROPELLER is particularly effective at reducing the effects of patient motion during data acquisition. Accordingly, PROPELLER is particularly useful for imaging patients, such as children, who tend to move or tremor during data acquisition.

In conventional PROPELLER scans, redundant low-frequency k-space data from overlapping blades is compared to one another to determine in-plane motion of the patient between acquisition of the k-space bladed. In this regard, the low-frequency k-space data is "gridded" from a Cartesian lattice to a polar lattice to estimate the patient's in-plane motion relative to a k-space reference blade or image. As such, in-plane motion in a given k-space blade is estimated by computing the convolution of the given k-space blade with a k-space reference blade. Nevertheless, while reasonably effective, the convolution is extremely smooth which makes identification of the maximum point in the convolution difficult to identify. The maximum point corresponds to the patient's position during acquisition of the given k-space blade relative to the k-space reference blade or image and is used to determine appropriate parameters of a motion correction algorithm. Accordingly, there is a need to make the maximum point of the convolution more conspicuous and, thus, easier to identify.

It would therefore be desirable to have a system and method for evaluating MR data, acquired with PROPELLER or a variant thereof, to determine in-plane motion of a subject during data acquisition that more significantly identifies a maximum peak of the convolution of a k-space blade with a k-space reference blade.

BRIEF DESCRIPTION OF THE INVENTION

The present invention provides a system and method of determining in-plane motion in MR data that overcomes the aforementioned drawbacks. Low frequency k-space data is processed and evaluated to effectively determine subject motion during the acquisition of the k-space data. In one embodiment, the convolution of a given k-space blade with a k-space reference blade is converted to a δ function with a well-defined peak that corresponds to the maximum point in the convolution. The relative position of this well-defined peak is used to determine subject motion during acquisition of the given k-space blade relative to the k-space reference blade. This present invention is particularly applicable for MR data acquired using PROPELLER, variants thereof, such as split-blade PROPELLER and TURBOPROP, as well as equivalents thereof.

Therefore, in accordance with one aspect of the invention, an MR system includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR system also includes a computer programmed to acquire a plurality of k-space blades from a subject in motion during data acquisition, each k-space blade rotated about a center of k-space. The computer is further programmed to determine a k-space reference blade and determine a high-pass convolution of a k-space blade with the reference k-space blade. The computer then determines, from the high-pass convolution, motion of the subject during acquisition of the k-space blade relative to the k-space reference blade.

In accordance with another aspect of the present invention, the MR system includes a plurality of gradient coils positioned about a bore of a magnet to impress a polarizing magnetic field and an RF transceiver system and an RF switch controlled by a pulse module to transmit RF signals to an RF coil assembly to acquire MR images. The system further has a computer programmed to acquire a plurality of k-space blades from a subject in motion during data acquisition, each k-space blade rotated about a center of k-space. The computer is further programmed to determine a k-space reference blade image and convert k-space data from a given k-space blade as well as a k-space reference blade to a common polar lattice. The computer is further programmed to Fourier transform the given k-space blade and the k-space referenced blade and determine a high-pass convolution of the Fourier transforms with respect to polar angle of the k-space reference blade and the given k-space blade. From the high-pass convolution, the computer is further programmed to determine in-plane rotation of the subject during acquisition of the k-space blade relative to the k-space reference blade.

According to another aspect, the present invention is directed to a method of MR imaging whereby a k-space blade extending through a center of k-space from a subject in motion is acquired. A high-pass convolution of the k-space blade with a reference k-space blade is designed so that the result is a δ function. In-plane motion of the subject during data acquisition of the k-space is then determined from the δ function.

In accordance with another aspect, the invention is embodied in a computer program stored on a computer readable storage medium and having instructions which, when executed by a computer, cause the computer to acquire a k-space blade extending through an origin of k-space from a subject in motion during data acquisition. The computer is further caused to represent the k-space blade on a polar lattice and determine a convolution of the k-space blade with a reference k-space blade. The computer is further programmed to high-pass filter the convolution and determine at least one of a rotational or a translational shift of the subject during acquisition of the k-space blade relative to the reference k-space blade.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

The present invention is directed to a method and system of determining in-plane motion of a subject during data acquisition with a PROPELLER, PROPELLER-variant, or equivalent protocol.

Figure 1:
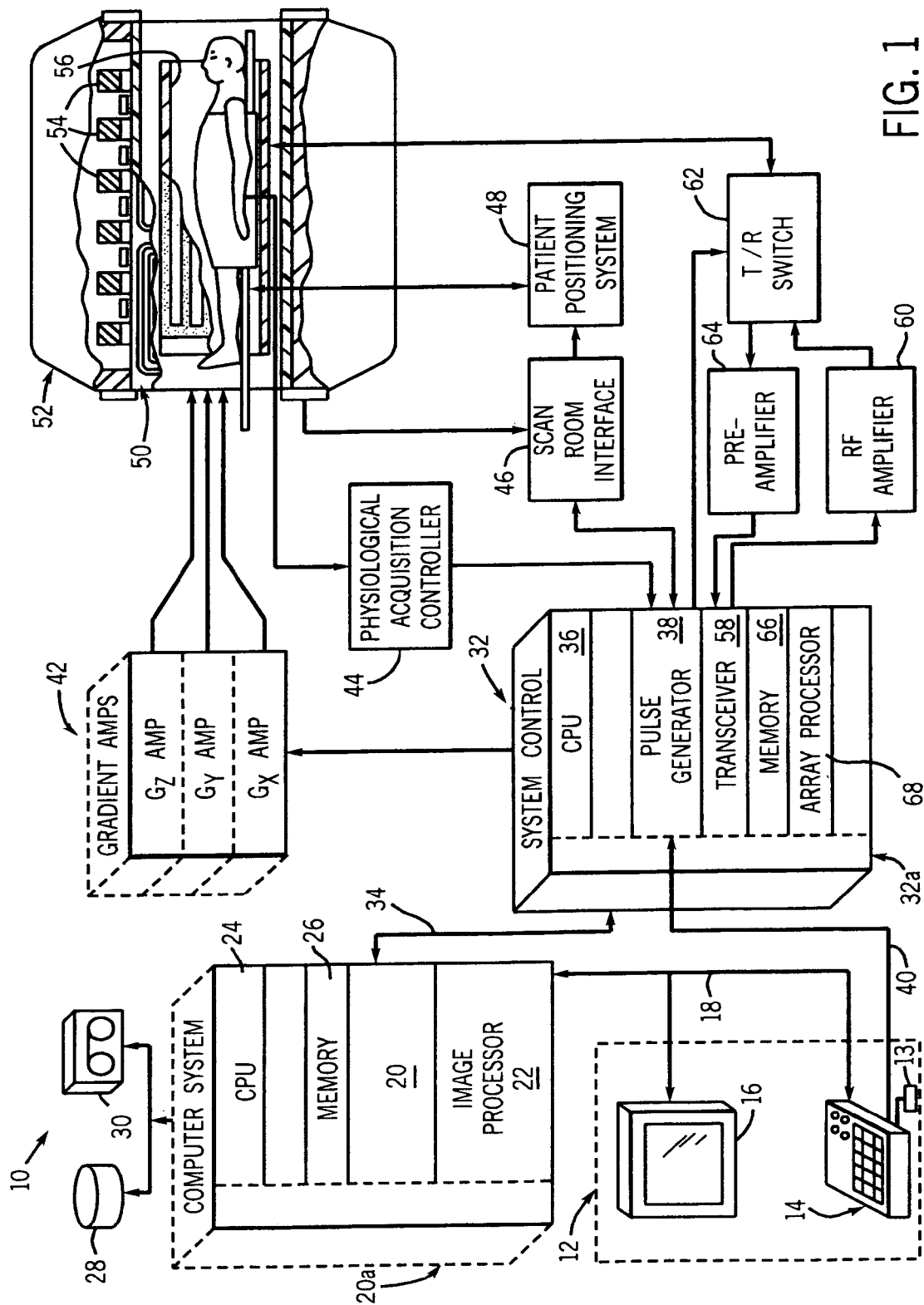
FIG. 1 is a schematic block diagram of an MR imaging system for use with the present invention.

Referring now to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. Finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to a variable-density multi-shot acquisition of MR data from a subject in motion during data acquisition using the MR system of FIG. 1, or equivalents thereof. This motion is generally the product of subject discomfort during the MR scan and is particularly prevalent in the imaging of children and those anxious about being placed in the bore of the magnet. In one embodiment, a PROPELLER acquisition, which can be either a fast spin echo (FSE) or "gradient and spin echo" (GRASE) imaging technique acquires MR data by collecting a rectangular strip, or "blade", of k-space during an echo train. With a PROPELLER acquisition, this strip is incrementally rotated in k-space about the k-space origin in subsequent repetition time (TR), thereby allowing adequate measurement of the necessary regions of k-space for a desired resolution and field-of-view. The spin echoes in the PROPELLER sequence mitigate T2* decay and susceptibility artifacts. Over-sampling the central region of k-space also reduces artifacts caused by subject motion and, thus, improves image quality.

Referring now with particularity to a PROPELLER based acquisition, since each blade or k-space segment extends through the center or central region of k-space, the PROPELLER acquisition provides a variable-density sampling of k-space. More particularly, the "blade" of k-space is rotated about the center of k-space with each subsequent TR of the pulse sequence. As such, with subsequent TRs, the blade, which extends through the central region of k-space, is rotated to sample the remaining portions of k-space while resampling the central region of k-space.

Figure 2:
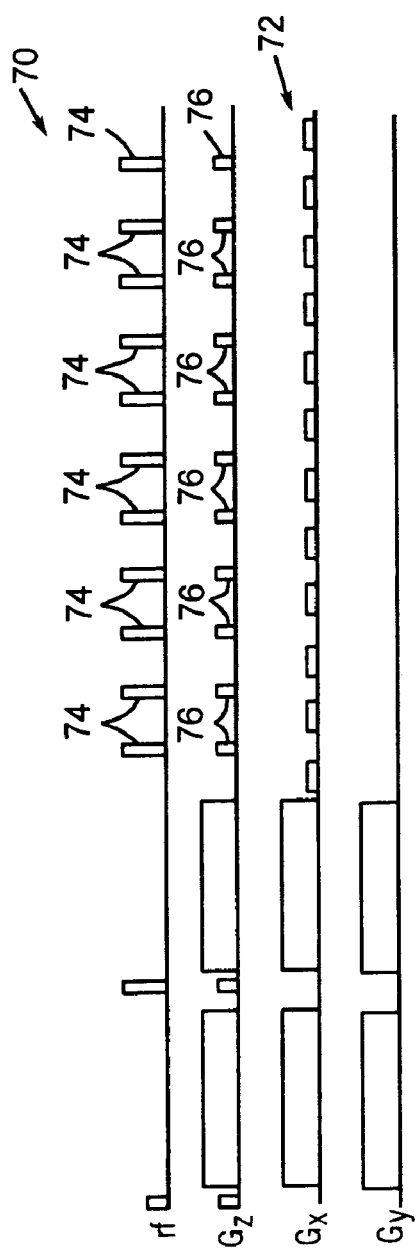
FIG. 2 is a diagram of a portion of a PROPELLER pulse sequence.

Referring now to FIG. 2, a portion of a pulse sequence 70 to acquire MR data in accordance with a PROPELLER protocol is shown. It should be noted that the phase encoding pulses, balancing gradients, and gradient crushers are not shown. The pulse sequence 70, in the illustrated example, is designed to acquire 12 spin-echoes 72 from a region of interest. The spin-echoes are all collected relative to a single axis, e.g. $G_x$. In this regard, the 12 spin-echoes include odd spin-echoes as well as even spin-echoes. Each spin-echo 72 is acquired following an RF refocusing pulse 74 and during a frequency encoding pulse 76, a series of which are played out during steady-state conditions. The spin echo data is used to fill k-space which is schematically represented in FIG. 3.

Figure 3:
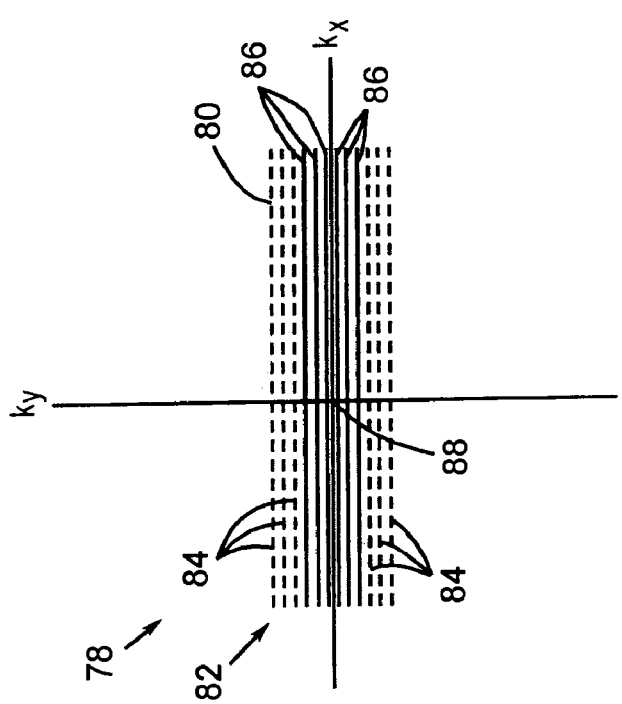
FIG. 3 illustrates a k-space blade acquired with the pulse sequence illustrated in FIG. 2.

FIG. 3 illustrates schematically a k-space 78 to be filled with MR data in accordance with one contemplated k-space filling scheme. With PROPELLER, each echo sampled corresponds to a single line 80 of k-space 78. As such, for a 12 spin-echo data acquisition, each blade 82 of k-space includes 12 lines of data. In the illustrated example, each dashed line 84 represents an odd spin-echo trajectory and the solid lines 86 represent the even spin-echo trajectories. As shown, the even spin-echoes 86 are placed in a center of the k-space blade 82 and the odd spin-echoes 84 are placed about a periphery of the even spin-echo lines 86. It is understood that the present invention is not limited to k-space blades having the orientation between odd and even echoes illustrated in FIG. 3.

As described, PROPELLER-based imaging implements a rotation of the blades of k-space data with each echo-train. In this regard, the blade of k-space will be incrementally rotated about the center 88 of k-space with each echo-train acquisition until k-space is filled. When the k-space is filled, the MR data will be processed for motion correction and other post-acquisition processes. After these corrections, estimates of patient motion are taken into account during final image reconstruction.

PROPELLER MR data is generally processed to estimate subject motion before image reconstruction. One known approach to determining subject motion during acquisition of a k-space blade is to evaluate the convolution of the blade image with a reference blade image. This convolution is evaluated via FFT, by first Fourier upsampling and then zero padding each k-space blade. Fourier upsampling k-space blades by a factor of 2 serves to double the FOV of the convolution, avoiding wrap-around. Zero-padding the k-space blades increases resolution of the convolution, making subsequent detection of the peak magnitude easier. Absent random noise, the maximum magnitude value of the convolution is positioned at the point corresponding to the shift, $x_{shift}$, of the k-space blade relative to the k-space reference blade. Given:

$$\rho_{ref}(y) = \rho(y - x_{shift}),$$ (Eqn. 1), where $\rho_{ref}(y)$ is the reference blade image and $\rho(y)$ is the blade image. Then the inner product of the blade image with translates of the reference blade image achieves its maximum at $x_{shift}$, as defined below:

$$\max_{\Delta x} \int \rho(y) \operatorname{conj}(\rho_{ref}(y + \Delta x)) dy = \qquad\text{(Eqn. 2)}$$
$$\int \rho(y) \operatorname{conj}(\rho_{ref}(y + x_{shift})) dy = |\rho|_{L^2}^2.$$

An estimate of $x_{shift}$ is determined in the Fourier domain by:

$$\int \rho(y) \operatorname{conj}(\rho_{ref}(y + \Delta x)) dy = [\hat\rho \operatorname{conj}(\hat\rho_{ref})]^{\vee}(\Delta x),\qquad\text{(Eqn. 3)}$$

where $\hat\rho$ denotes the Fourier transform and $\rho^{\vee}$ is the inverse Fourier transform.

Figure 4:
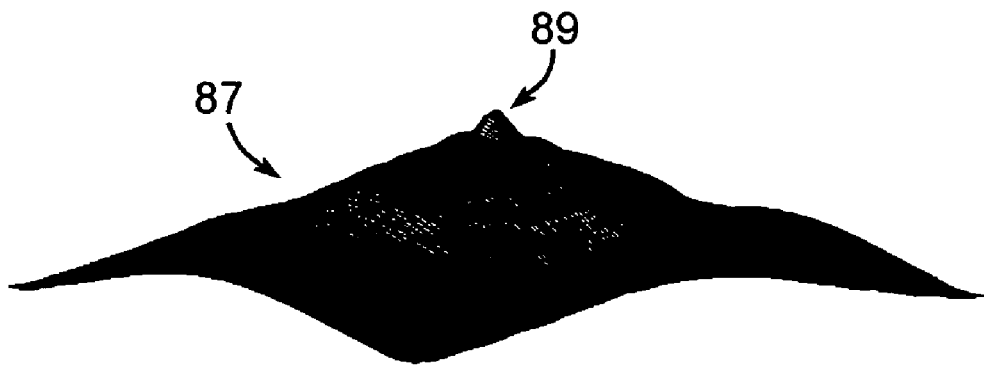
FIG. 4 is a graphical illustration of the convolution of a blade image with a reference blade image.

For datasets with $\rho(x) = \rho_{ref}(x - x_{shift}) + n(x)$ where n is Gaussian noise yield the standard convolution of a blade, $\rho$, with $\rho_{ref}$ is close to the $L^2$ norm of the "true" noise-free convolution. For purposes of determining the appropriate parameters for a motion correction algorithm, the point $x_{shift}$, rather than the convolution function itself, is desired. What can be problematic, however, is that the convolution function is generally very smooth and, as a result, the maximum point is not well-defined. This is illustrated in FIG. 4. As shown, the magnitude of the convolution 87 has a unique maximum point 89, but is difficult to localize on a low-frequency discrete lattice. Zero-padding k-space blades increases resolution of the final convolution, further reducing the difficulty of localizing the peak signal.

Accordingly, the present invention is directed to high-pass filtering of the convolution of a k-space blade image with a k-space reference blade image to determine subject motion (translational and/or rotational shift) during acquisition of the data for the k-space blade image. As will be described, this high-pass filtering will be repeated for each k-space blade image that is acquired to determine the relative shift of each k-space blade image. The k-space reference blade image, in one embodiment, is generated from the average of all k-space blade images of a given k-space. However, it is contemplated that the k-space reference blade images may be determined from the k-space blades of one or more scout scans. Additionally, it is recognized the k-space blade image acquired immediately before or after a given k-space blade image may be used as the k-space reference blade image for the given k-space blade image.

Figure 5:
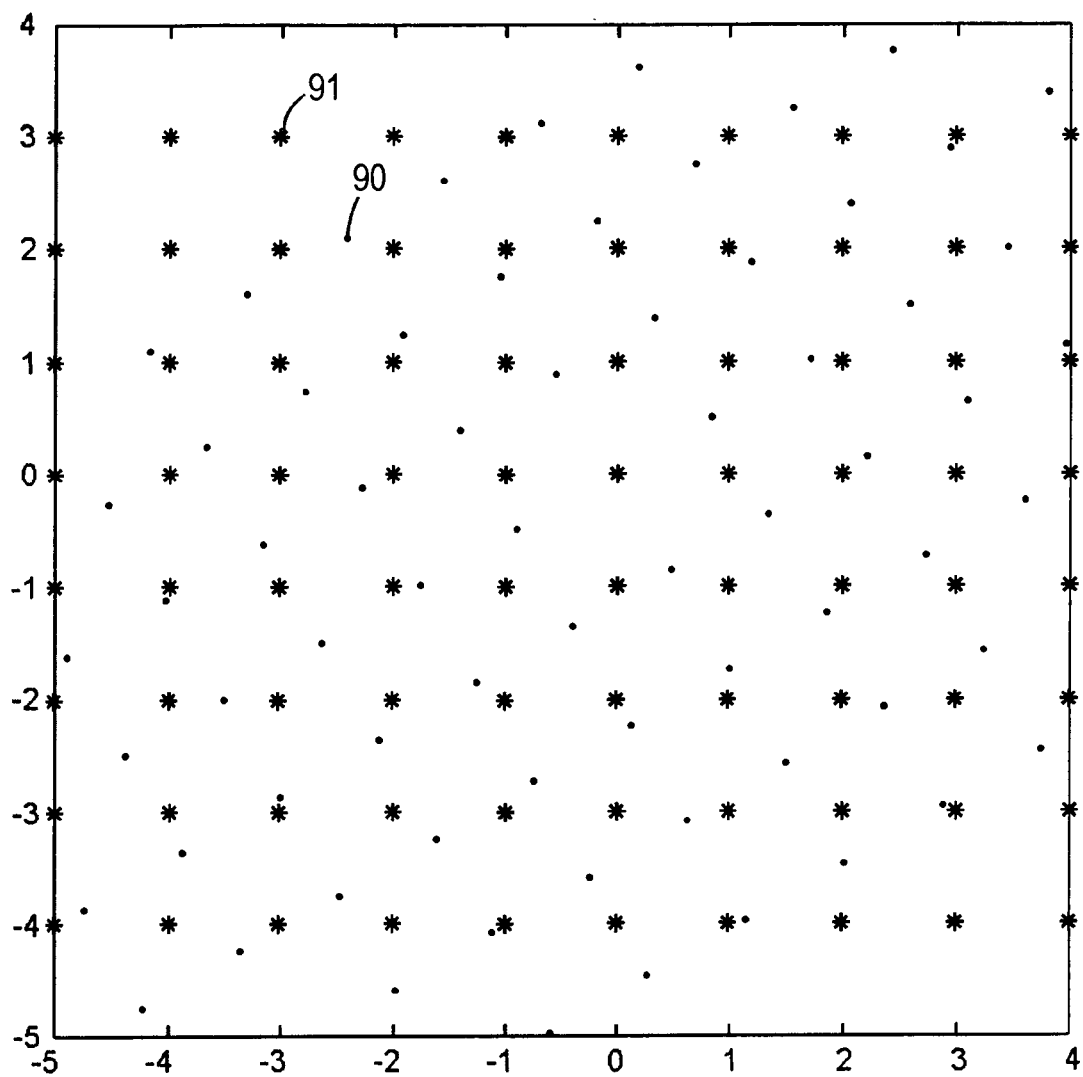
FIG. 5 is a graphical illustration of the k-space blade of FIG. 3 arranged on a Cartesian lattice.
Figure 6:
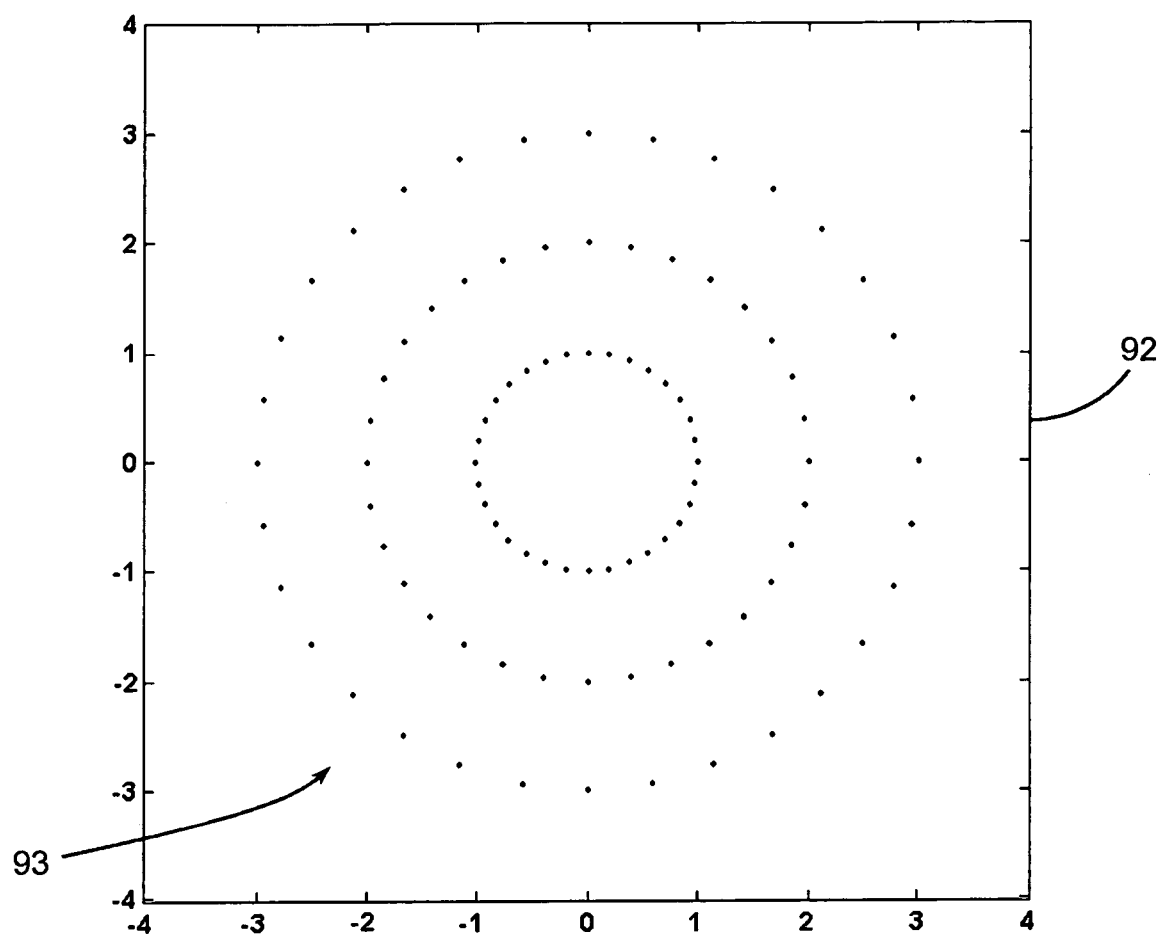
FIG. 6 is a graphical illustration of the k-space blade illustrated in FIG. 5 arranged on a polar lattice.

A post-acquisition procession technique to determine subject motion during data acquisition in accordance with the present invention will now be described with respect to FIGS. 5–7. Referring now to FIG. 5, the data of a given k-space blade (for instance, k-space blade 82 of FIG. 3) is shown measured on a Cartesian grid rotated by the acquisition blade angle schematically represented as "dots" 90. The k-space data 90 of the Cartesian grid is then transformed onto the Cartesian lattice of the first blade acquired, generally referenced as "stars" 91. This is done so that the center of each k-space blade is sampled at exactly the same points in k-space. In another embodiment, the k-space data 90 is transformed onto the polar lattice 92 of FIG. 6 using one of a number of known transformation techniques. More particularly, the k-space data 93 of the polar lattice 92 and/or Cartesian lattice 91 is evaluated using a Slow Fourier Transform or other algorithm, such as a standard gridding technique. A convolution of the blade image rotated by the blade rotation angle and the reference blade image is then determined to estimate in-plane translation. Similarly, the 1D convolution of the Fourier transform with respect to the polar angle of data on the polar lattice 92 is convolved with the 1D Fourier transform of the reference blade's polar data.

The convolution is a high-pass convolution. For purposes of this invention, the upper half of the frequency band comprises the high frequency components. In this regard, the maximum magnitude point of the convolution, max $$\max\left[\frac{\hat{\rho}conj(\hat{\rho}_{ref})}{|\hat{\rho}conj(\hat{\rho}_{ref})|^\alpha}\right]^\vee(x),$$

Eqn. 4 is achieved at $x=x_{shift}$ for $0\leq\alpha$ a real parameter.

In terms of amplitude and phase, Eqn. 4 can be expressed as:

$$\hat{\rho}(k)=A(k)e^{i\phi(k)} \qquad \text{(Eqn. 5)}$$

$$\hat{\rho}_{ref}(k)=A_{ref}(k)e^{i\phi_{ref}(k)} \qquad \text{(Eqn. 6)}$$

$$\max\left[\frac{\hat{\rho}conj(\hat{\rho}_{ref})}{\hat{\rho}conj(\hat{\rho}_{ref})^\alpha}\right](x)=\max\left[[AA_{ref}]^{1-\alpha}e^{i(\phi-\phi_{ref})}\right]^\vee(x), \qquad \text{(Eqn. 7)}$$

where:

$\hat{\rho}(k)$, $\hat{\rho}_{ref}(k)$ are k-space data of the blade and reference blade, $A(k)$, $A_{ref}(k)$ are real valued amplitudes of blade and reference data, and $\phi(k)$, $\phi_{ref}(k)$ are the phase of the blade and reference blade data in radians.

Figure 7:
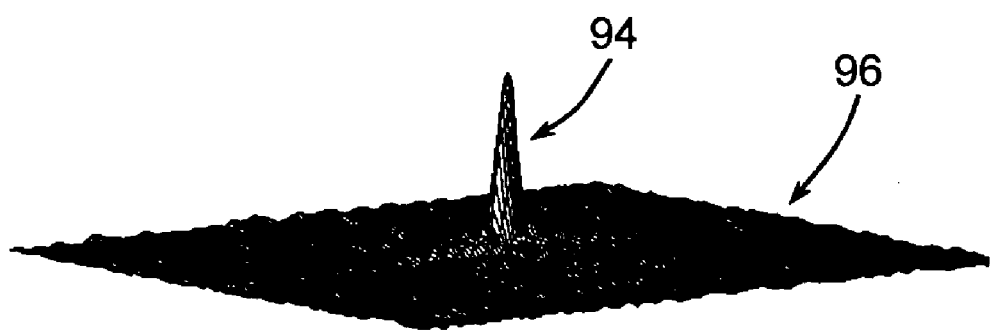
FIG. 7 is a graphical illustration of an approximate δ function generated from the convolution of the image of the k-space blade's phase with the image of a k-space reference blade's phase.

Assuming that the k-space data is noise-free and with only a shift between $\rho$ and $\rho_{ref}$, and setting $\alpha=1.0$, then the high-pass convolution results in a delta function with a well-defined peak 94, as shown in FIG. 7. That is, setting $\alpha=1.0$, the convolution of the k-space blade with the k-space reference blade is effectively high-pass filtered to result in the $\delta$ function illustrated in FIG. 7 with well-defined peak 94. In this regard, non-maximum magnitude data 96 is effectively quashed thereby making peak 94 conspicuous and easily identifiable. As referenced above, the position rather than the magnitude of the peak is used to determine a shift in the k-space blade relative to the k-space reference blade that is typically the result of subject motion during acquisition of the k-space blade. The $\delta$ function may be defined by:

$$\delta(x-x_{shift})=\left[\frac{\hat{\rho}conj(\hat{\rho}ref)}{|\hat{\rho}conj(\hat{\rho}ref)|}\right]^\vee(x). \qquad \text{(Eqn. 8)}$$

Once the point of shift is identified and localized, an appropriate motion correction algorithm can be identified and implemented in accordance with known motion correction techniques.

While an exemplary value of $\alpha=1.0$ has been described, it is understood that other values may be used. For example, testing suggests that $\alpha=\frac{1}{2}$ yields a well-defined peak that can be quickly identified. Moreover, it is preferred that $\alpha\geq 0$. Also, an exemplary value of $\alpha=1.0$ was used for noise-free data; however, it is recognized that other values may be preferred for MR data having noise.

Additionally, while the high-pass filter defined by Eqn. 4 is preferred, it understood that other high-pass filters may be used. For example, the high-pass filter may be defined by the following expression:

$$\max[\hat{\rho}(k)conj(\hat{\rho}_{ref}(k))|k|^\beta]^\vee(x)=x_{shift} \text{ for } \beta\geq 0 \qquad \text{(Eqn. 9)}.$$

The present invention has been described with respect to determining motion in a subject during acquisition of a k-space blade using PROPELLER. It is understood, however, that the present invention may also used in PROPELLER-variant acquisitions, such as split-blade PROPELLER and TURBOPROP, as well as equivalents thereof. Additionally, the present invention can be used to effectively identify and localize subject motion embodied as translational shift and/or rotational shift. In this regard, the present invention can be carried out with 1D as well as 2D convolutions. Accordingly, the present invention improves image quality by providing more accurate estimates of rotation and/or shift.

Therefore, in accordance with one embodiment of the invention, an MR system includes a plurality of gradient coils positioned about a bore of a magnet to impress a polarizing magnetic field. An RF transceiver system and an RF switch are controlled by a pulse module to transmit and receive RF signals to and from an RF coil assembly to acquire MR images. The MR system also includes a computer programmed to acquire a plurality of k-space blades from a subject in motion during data acquisition, each k-space blade rotated about a center of k-space. The computer is further programmed to determine a k-space reference blade and determine a high-pass convolution of a k-space blade image with the reference k-space blade image. The computer then determines, from the high-pass convolution, motion of the subject during acquisition of the k-space blade relative to the k-space reference blade.

In accordance with another embodiment of the present invention, the MR system includes a plurality of gradient coils positioned about a bore of a magnet to impress a polarizing magnetic field and an RF transceiver system and an RF switch controlled by a pulse module to transmit RF signals to an RF coil assembly to acquire MR images. The system further has a computer programmed to acquire a plurality of k-space blades from a subject in motion during data acquisition, each k-space blade rotated about a center of k-space. The computer is further programmed to determine a k-space reference blade image and convert k-space data from a given k-space blade as well as a k-space reference blade to a common polar lattice. The computer is further programmed to Fourier transform the given k-space blade and the k-space referenced blade and determine a high-pass convolution of the Fourier transforms with respect to polar angle of the k-space reference blade and the given k-space blade. From the high-pass convolution, the computer is further programmed to determine in-plane rotation of the subject during acquisition of the k-space blade relative to the k-space reference blade.

According to another embodiment, the present invention is directed to a method of MR imaging whereby a k-space blade extending through a center of k-space from a subject in motion is acquired. A high-pass convolution of the k-space blade with a reference k-space blade is then determined and converted to a δ function. In-plane motion of the subject during data acquisition of the k-space is then determined from the δ function.

In accordance with another embodiment, the invention is embodied in a computer program stored on a computer readable storage medium and having instructions which, when executed by a computer, cause the computer to acquire a k-space blade extending through an origin of k-space from a subject in motion during data acquisition. The computer is further caused to represent the k-space blade on a rotated lattice and determine a convolution of the k-space blade with a reference k-space blade. The computer is further programmed to high-pass filter the convolution and determine at least one of a rotational or a translational shift of the subject during acquisition of the k-space blade relative to the reference k-space blade The present invention has been described in terms of the preferred embodiment, and it is recognized that equivalents, alternatives, and modifications, aside from those expressly stated, are possible and within the scope of the appending claims.

What is claimed is:

1. A magnetic resonance (MR) system comprising:
    a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
        acquire a plurality of k-space blades from a subject in motion during data acquisition, each k-space blade rotated about a center of k-space;
        determine a k-space reference blade;
        determine a high-pass convolution of a k-space blade with the reference k-space blade; and
        from the high-pass convolution, determine in-plane motion of the subject during acquisition of the k-space blade relative to the k-space reference blade.

2. The MR system of claim 1 wherein the computer is further programmed to determine at least one translational shift of the subject during acquisition of the k-space blade relative to the k-space reference blade from the high-pass convolution.

3. The MR system of claim 1 wherein the computer is further programmed to iteratively determine a high-pass convolution for each of the plurality of k-space blades with the reference k-space blade.

4. The MR system of claim 1 wherein the computer is further programmed to determine the high-pass convolution from the following expression $$\left[\frac{\hat{\rho} conj(\hat{\rho}_{ref})}{|\hat{\rho} conj(\hat{\rho}_{ref})|^{\alpha}}\right]^{\nu} = \left[[AA_{ref}]^{1-\alpha}e^{i(\phi-\phi_{ref})}\right]^{\nu},$$

where:

$\hat{\rho}(k) = A(k)e^{i\phi(k)}$ and $\hat{\rho}_{ref}(k) = A_{ref}(k)e^{i\phi_{ref}(k)}$.

5. The MR system of claim 1 wherein the computer is further programmed to acquire one of 2D or 3D MR data from the subject.

6. The MR system of claim 1 wherein the computer is further programmed to determine the k-space reference blade from an average of the plurality of k-space blades.

7. The MR system of claim 1 wherein the computer is further programmed to convert the k-space blade from a Cartesian lattice to another rotated Cartesian lattice and evaluate the rotated lattice points with either a slow Fourier Transform or gridding.

8. The MR system of claim 1 wherein the computer is further programmed to Fourier upsample k-space blades by a factor of 2.

9. The MR system of claim 1 wherein the computer is further programmed to zero-pad k-space blades to increase image-space resolution of the convolution, thereby reducing the difficulty of peak localization.

10. The MR system of claim 1 wherein the computer is further programmed to convert the high-pass convolution of the k-space blade to an approximate δ function and determine a maximum magnitude of the approximate δ function.

11. The MR system of claim 1 wherein the computer is further programmed to acquire the plurality of k-space blades with a PROPELLER or a PROPELLER-variant acquisition.

12. A magnetic resonance (MR) system comprising:
    a plurality of gradient coils positioned about a bore of a magnet to impress a polarizing magnetic field and an RF transceiver system and an RF switch controlled by a pulse module to transmit RF signals to an RF coil assembly to acquire MR images; and
    a computer programmed to:
        acquire a plurality of k-space blades from a subject in motion during data acquisition, each k-space blade rotated about a center of k-space;
        determine a k-space reference blade;
        convert k-space data from a given k-space blade as well as the k-space reference blade to a common polar lattice;
        Fourier transform the given k-space blade and the k-space referenced blade to a given blade image and a reference blade image, respectively;
        determine a high-pass convolution of the given blade image and the reference blade image with respect to a polar angle of the k-space reference blade and the given k-space blade; and from the high-pass convolution, determine in-plane rotation of the subject during acquisition of the given k-space blade relative to the k-space reference blade.

13. The MR system of claim 12 wherein the computer is further programmed to determine at least one rotational shift of the subject during acquisition of the given k-space blade relative to the k-space reference blade from the high-pass convolution.

14. The MR system of claim 12 wherein the computer is further programmed to iteratively determine 1D high-pass convolutions with respect to a polar angle for each of the plurality of k-space blades with the k-space reference blade.

15. The MR system of claim 12 wherein the computer is further programmed to determine the high-pass convolution from the following expression:

$$\left[\frac{\hat{\rho}conj(\hat{\rho}_{ref})}{|\hat{\rho}conj(\hat{\rho}_{ref})|^\alpha}\right]^\vee = \left[[AA_{ref}]^{1-\alpha}e^{i(\phi-\phi_{ref})}\right]^\vee,$$

where:

$\hat{\rho}(k)=a(k)e^{i\phi(k)}$ and $\hat{\rho}_{ref}(k)=A_{ref}(k)e^{i\phi_{ref}(k)}$.

16. The MR system of claim 12 wherein the computer is further programmed to acquire one of 2D or 3D MR data from the subject.

17. The MR system of claim 12 wherein the computer is further programmed to determine the k-space reference blade from an average of the plurality of k-space blades.

18. The MR system of claim 12 wherein the computer is further programmed to convert the k-space data from a Cartesian lattice to the polar lattice and evaluate the polar lattice with a slow Fourier Transform or gridding.

19. The MR system of claim 12 wherein the computer is further programmed to convert the high-pass convolution of the given blade image to an approximate δ function and determine a maximum magnitude of the δ function.

20. The MR system of claim 12 wherein the computer is further programmed to zero-pad the k-space data with respect to the polar angle in order to increase resolution of the convolution, thereby reducing the difficulty of peak localization.

21. The MR system of claim 12 wherein the computer is further programmed to acquire the plurality of k-space blades with a PROPELLER or a PROPELLER-variant acquisition.

22. The MR system of claim 12 wherein the computer is further programmed to determine subject in-plane rotation from the high-pass convolution of the Fourier transform of the given k-space blade evaluated on a polar lattice with the Fourier transform of the k-space reference blade evaluated on a polar lattice.

23. A method of MR imaging comprising the steps of:
(A) acquiring a k-space blade extending through a center of k-space from a subject in motion during data acquisition;
(B) determining a high-pass convolution of the k-space blade with a reference k-space blade; and
(C) determining in-plane subject motion from the high-pass convolution.

24. The method of claim 23 further comprising the step of (D) applying a motion correction to the k-space blade based on the in-plane subject motion.

25. The method of claim 24 further comprising the step of acquiring multiple k-space blades, each k-space blade extending through the center of k-space, and repeating steps (B)–(C) for each k-space blade.

26. The method of claim 25 further comprising the step of acquiring the multiple k-space blades with a PROPELLER acquisition or a PROPELLER-variant acquisition.

27. The method of claim 23 further comprising the step of gridding high-frequency k-space data of the k-space blade from a Cartesian lattice to a rotated Cartesian lattice before determining the high-pass convolution.

28. The method of claim 23 further comprising the step of gridding high-frequency k-space data of the k-space blade from a Cartesian lattice to a polar lattice before determining the high-pass convolution.

29. The MR method of claim 23 wherein the computer is further programmed to Fourier upsample k-space blades by a factor of 2.

30. The MR method of claim 23 wherein the computer is further programmed to zero-pad k-space blades to increase image-space resolution of the convolution, thereby reducing the difficulty of peak localization.

31. A computer readable storage medium having a computer program stored thereon and representing a set of instructions that when executed by a computer causes the computer to:
acquire a k-space blade extending through an origin of k-space from a subject in motion during data acquisition;
represent the k-space blade on a polar lattice;
determine a convolution of the k-space blade with a reference k-space blade;
high-pass filter the convolution; and
determine at least one of a rotational or a translational shift of the subject during acquisition of the k-space blade relative to the reference k-space blade.

32. The computer readable storage medium of claim 31 wherein the set of instructions further causes the computer to define the reference k-space blade as a blade of k-space acquired from the subject immediately before the k-space blade.

33. The computer readable storage medium of claim 31 wherein the set of instructions further causes the computer to acquire the k-space blade with a PROPELLER or a PROPELLER-variant acquisition.

34. The computer readable storage medium of claim 31 wherein the set of instructions further causes the computer to apply an in-plane subject motion correction to the k-space blade based on the at least one of rotational or translational shift.

* * * * *

UNITED STATES PATENT AND TRADEMARK OFFICE
CERTIFICATE OF CORRECTION

PATENT NO. : 7,176,684 B2  
APPLICATION NO. : 11/170054  
DATED : February 13, 2007  
INVENTOR(S) : Patch et al.

It is certified that error appears in the above-identified patent and that said Letters Patent is hereby corrected as shown below:

On Cover Sheet, within Inventors,
    delete "Glendarle" and substitute therefore-- Glendale --, Col. 12, lines 11 (Claim 25), delete "(B)-(C)" and substitute therefore -- (B)-(D) --.

Signed and Sealed this

Tenth Day of April, 2007

JON W. DUDAS  
*Director of the United States Patent and Trademark Office*